United States Patent
McDonald et al.

(10) Patent No.: US 9,372,210 B1
(45) Date of Patent: Jun. 21, 2016

(54) DYNAMIC POWER FET SWITCHING

(71) Applicant: Silego Technology, Inc., Santa Clara, CA (US)

(72) Inventors: John Othniel McDonald, Mountain House, CA (US); Jay Li, Sunnyvale, CA (US); Nathan Willis John, Morgan Hill, CA (US)

(73) Assignee: Silego Technology, Inc., Santa Clara, CA (US)

( * ) Notice: Subject to any disclaimer, the term of this patent is extended or adjusted under 35 U.S.C. 154(b) by 11 days.

(21) Appl. No.: 14/311,124

(22) Filed: Jun. 20, 2014

Related U.S. Application Data

(60) Provisional application No. 61/837,579, filed on Jun. 20, 2013.

(51) Int. Cl.
*H03K 3/012* (2006.01)
*G01R 19/00* (2006.01)

(52) U.S. Cl.
CPC ............ *G01R 19/0092* (2013.01); *H03K 3/012* (2013.01)

(58) Field of Classification Search
CPC .... G01R 19/00; G01R 19/0092; H03K 17/00; H03K 17/04123; H03K 17/063; H03K 17/0822; H03K 17/687; H03K 2217/00; H03K 2217/0036; H03K 3/00; H03K 3/012
USPC ......................................................... 327/427
See application file for complete search history.

(56) References Cited

U.S. PATENT DOCUMENTS

| 4,532,443 | A | 7/1985 | Glennon |
| 7,138,778 | B2 | 11/2006 | Fujino et al. |
| 7,982,446 | B2 | 7/2011 | Noon et al. |
| 8,183,892 | B2 | 5/2012 | Gillberg |
| 8,358,157 | B2 | 1/2013 | Gillberg |
| 8,538,368 | B1 | 9/2013 | Campbell |
| 2010/0253268 | A1* | 10/2010 | Marvelly ................. 318/400.26 |
| 2012/0043818 | A1* | 2/2012 | Stratakos et al. ............... 307/77 |

FOREIGN PATENT DOCUMENTS

| WO | 9831092 | 7/1998 |
| WO | 2012099866 | 7/2012 |

* cited by examiner

*Primary Examiner* — John Poos
*Assistant Examiner* — David Mattison
(74) *Attorney, Agent, or Firm* — Van Pelt, Yi & James LLP

(57) ABSTRACT

Various techniques for dynamic power FET switching are disclosed. In some embodiments, a device comprises an array of two or more independently switchable power MOSFETs that are configured to sense current in a high current mode and a low current mode as well as circuitry for automatically switching from the low current mode to the high current mode when sensed current is above a threshold to switch to the high current mode.

32 Claims, 3 Drawing Sheets

DYNAMIC POWER FET SWITCHING

CROSS REFERENCE TO OTHER APPLICATIONS

This application claims priority to U.S. Provisional Patent Application No. 61/837,579, entitled DYNAMIC POWER FET SWITCHING, filed Jun. 20, 2013, which is incorporated herein by reference for all purposes.

BACKGROUND OF THE INVENTION

Improvements in power semiconductor technology have resulted in devices capable of supporting higher currents and having lower resistances, making it challenging to measure current in such devices during low current states. Thus, improved techniques for making current sense easier in a widely varying power environment are needed.

BRIEF DESCRIPTION OF THE DRAWINGS

Various embodiments of the invention are disclosed in the following detailed description and the accompanying drawings.

DETAILED DESCRIPTION

Figure 1A:
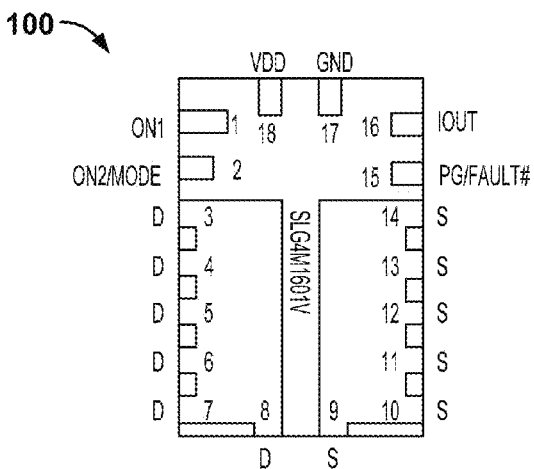
FIG. 1A illustrates an embodiment of a pin configuration of an integrated circuit comprising a power switch having current sense capability.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Advances in power semiconductor technology have led to devices with higher current and lower resistance capability. $R_{DSon}$ (drain to source resistance in an on state) is a measure of electrical resistance in a circuit and is one of the most critical parameters for evaluating the quality of a power semiconductor device. Lowering of resistance reduces power loss in a system and, therefore, reduces heat and increases power efficiency.

A measurement that is often needed in power systems is determining the current that is flowing in a system. This is done by measuring the voltage drop across one or more devices in the system.

Paradoxically, as the $R_{DSon}$ in devices within a system goes down, accurate measurement of current becomes harder, as the voltage drop across the resistance also goes down. The voltage drop across the resistor is the signal under consideration. As this signal gets smaller, the noise sources in an associated system will become proportionally larger. This will require more accurate and, therefore, more expensive circuitry to measure the current.

Power systems typically must support widely varying load levels. A designer must pick the performance on power FET devices to match peak current levels expected in a system. The worst case problem is measuring low current levels when power FET devices have been sized for maximum current levels. In these cases, the signal is low because the current is low, and the signal is even lower because resistance in power FET devices is also very low. This problem is made worse by the typical wide dynamic range in power system usage.

Techniques for making current sense easier in a widely varying power environment are disclosed. In some embodiments, a power device comprises one or more sub-units that can be dynamically switched in various modes. Such a device comprises one or more high current modes for regular operation as well as one or more low current modes for measuring current levels more accurately when system current is (or is expected to be) below some level.

In some embodiments, a device comprises an array of two or more power MOSFETs (metal-oxide-semiconductor field-effect transistors), which can be controlled in any number of subsets, up to and including each FET individually. Thus, such a device may be configured to form one or more sub-arrays. Some or all of these sub-arrays may be switched to create one or more power modes. In some cases, switching control is given to a designer using the device in a system, e.g., via one or more pins, commands, etc. In some cases, switching control is completely generated internally in the device. In some cases, switching control is shared between a system designer and the device, with each party having control of some state transitions. High (or higher) power modes are for normal operation. Low (or lower) power modes are for more accurate measurement during low current periods.

In some embodiments, the current flowing through the arrays (some of which may be off at the time) is measured to determine the total current flowing through the device. In some cases, a protection mechanism is included via which the device senses when the current level is too high to remain in a low current mode, causing the device to automatically switch itself back to a high current mode. The instantaneous current flowing through the device that is measured may be reported to an external device, for example, in an analog or digital format.

FIG. 1A illustrates an embodiment of a pin configuration of an integrated circuit 100 comprising a power switch having current sense capability. In the given example, pin 1 comprises a programmable logic CMOS (complementary metal-oxide-semiconductor) input; pin 2 comprises a programmable logic CMOS input or comprises a current mode selection input (e.g., a low input comprises a high current mode and a high input comprises a low current mode); fused pins 3-8 comprise the drain of the power MOSFET; fused pins 9-14 comprise the source of the power MOSFET; pin 15 comprises a multipurpose status output pin (e.g., when pin 15 asserts high, it acts as a power good output signal and when pin 15 asserts low, it acts as a fault notification signal); pin 16 comprises a current output; pin 17 comprises ground; and pin 18 comprises $V_{DD}$ power for load switch control/operation.

Figure 1B:
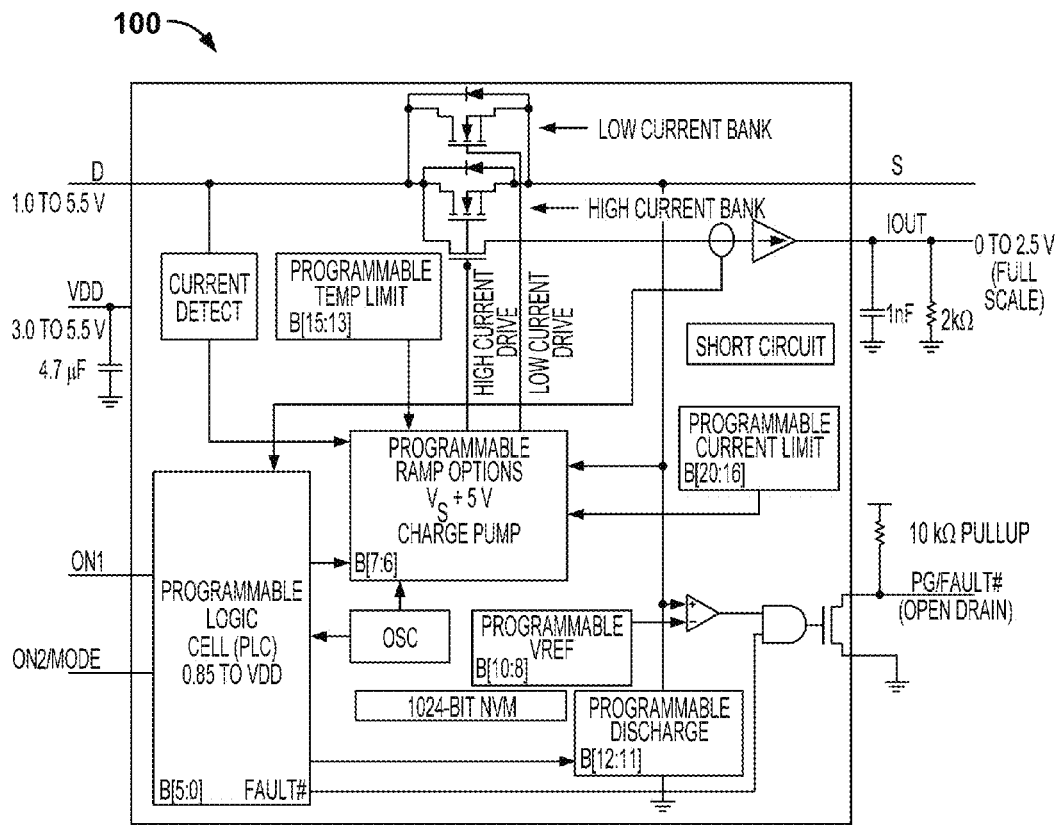
FIG. 1B illustrates an embodiment of a high level block diagram of a power switch.

FIG. 1B illustrates an embodiment of a high level block diagram of integrated circuit 100. For example, integrated circuit 100 may comprises a 3.8 mΩ, 10 A, single channel load switch that is able to switch 1 to 5 V power rails and is packaged in an ultra-small (e.g., 2×3 mm) QFN (quad-flat no-leads) 18L FC package. That is, in this example, the load switch has a 3.8 mΩ $R_{DSon}$ while supporting 10 A of current. When the switch is turned off, the load is discharged. As depicted, the load switch comprises circuitry for over current protection modes (e.g., short circuit current limit and active current limit) and over temperature protection as well as NVM (non-volatile memory) programmable configurations for ramp rate, discharge, logic cell, temperature limit, and current limit.

In the given example, load switch 100 comprises two independently switchable MOSFETs that dynamically facilitate a step change in performance and function as power passing MOSFETs as well as current sensing MOSFETs. That is, the power MOSFETs of load switch 100 also comprises current sense MOSFETs of the device. In various embodiments, the MOSFETs of load switch 100 may comprise different sizes and are arranged in vertical or lateral configurations. Moreover, load switch 100 comprises select signals for high and low current measurement modes as well as circuitry to automatically switch from low to high current mode, e.g., when the sensed current is above a threshold, and vice versa. A wide $I_{DS}$ current sensing range (e.g., 50 mA to 10 A) is provided by the given configuration.

A specific set of operating features and configuration of load switch 100 are described with respect to FIGS. 1A-1B for the purpose of example. In other embodiments, a load switch may comprise any other appropriate device specifications and configuration. Moreover, load switch 100 may comprise any number of FETs and low/high current modes. Example applications of load switch 100 include notebook power rail switching, tablet power rail switching, server power rail switching, telecommunications equipment power rail switching, etc.

Figure 2:
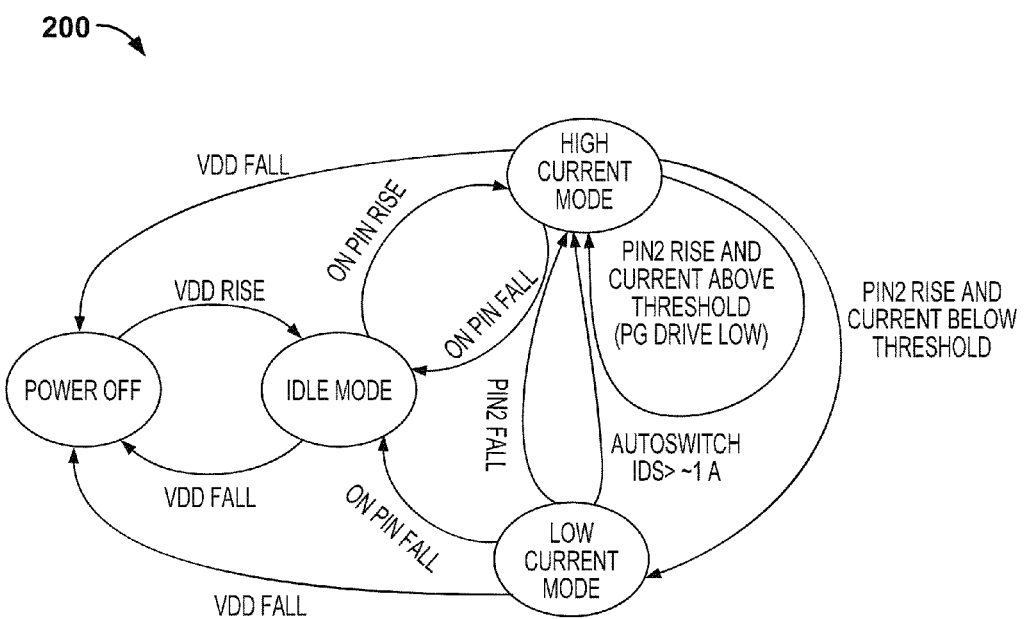
FIG. 2 illustrates an embodiment of a state diagram of the current sense states of a load switch.

FIG. 2 illustrates an embodiment of a state diagram 200 of the current sense states of a load switch, such as load switch 100 of FIGS. 1A-1B. In the given example, the device powers up in high current mode as a default setting. In the aforementioned example, the maximum $I_{DS}$ in high current mode is 10 A. When pin 2 of load switch 100 is driven from low to high, the internal power FET array shuts down seven out of eight banks and keeps one out of eight banks active. Low current mode allows the system to get a more precise current sense reading when instantaneous $I_{DS}$ is low (e.g., between 50 mA to 750 mA). In low current mode, the $I_{OUT}$ output (pin 16) scales up by a prescribed number of times (e.g., by eight times) to produce a higher current level reading. In the cases in which a system does not need precise current reading at low $I_{DS}$, it may be desirable to stay in high current mode at all times by tying MODE (pin 2) to GND.

In some embodiments, the load switch can (automatically) switch to low current mode when the instantaneous $I_{DS}$ is less than a prescribed threshold value (e.g., 750 mA). If the device attempts to switch to low current mode while the instantaneous $I_{DS}$ is higher than the prescribed threshold (e.g., 750 mA), the device's internal control logic will block this operation. Rather, the device keeps the FET array in high current mode to prevent any system failures. In some cases, the device may assert FAULT# (pin 15) low to notify the system that the attempt to switch to low current mode has failed. In some embodiments, if $I_{DS}$ increases above an auto-switch trigger threshold (e.g., 1 A), the device automatically switches back to high current mode, e.g., by turning on all (eight) banks of the FET array.

Figure 3A:
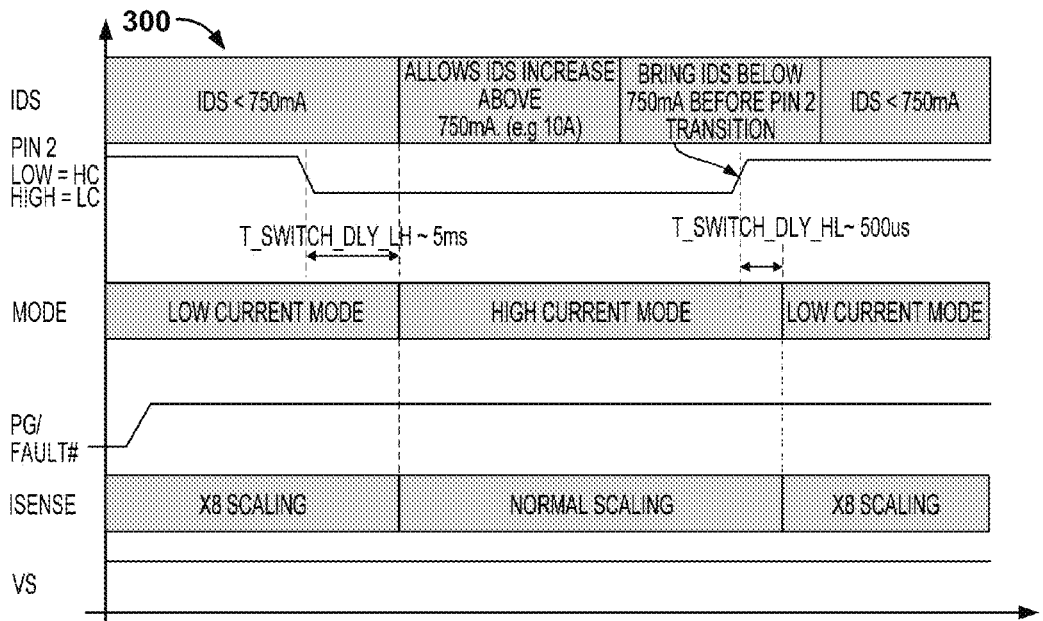
FIG. 3A illustrates an embodiment of a timing diagram depicting transitions between high and low current sensing modes.
Figure 3B:
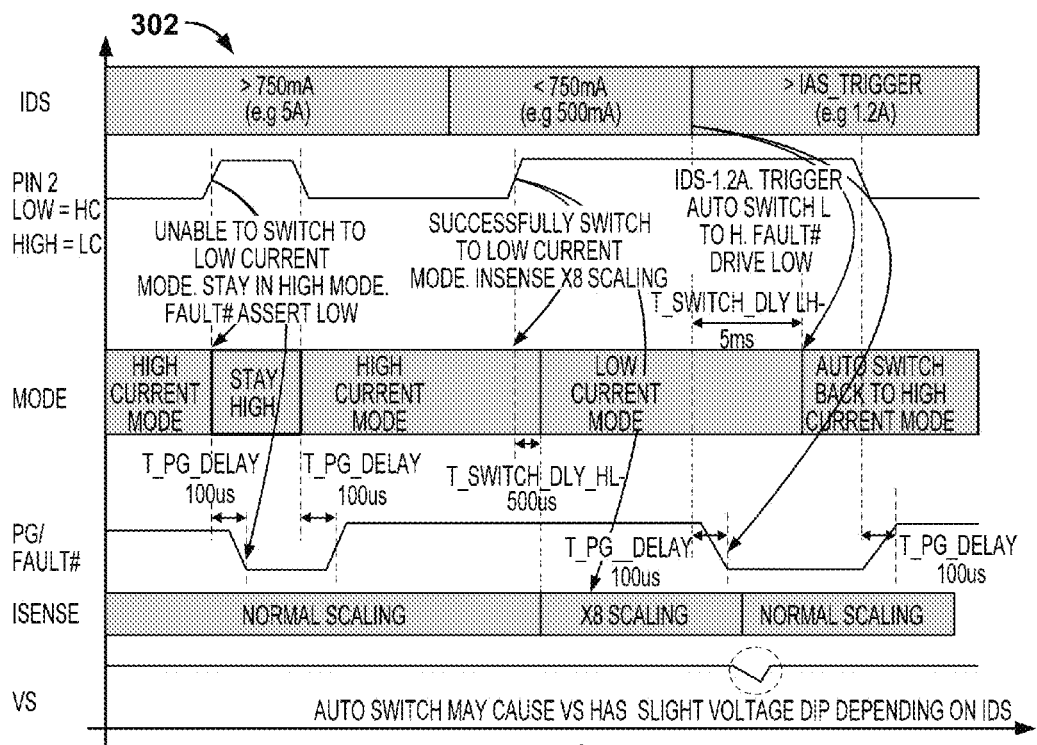
FIG. 3B illustrates an embodiment of a timing diagram depicting illegal and auto mode transitions.

FIG. 3A illustrates an embodiment of a timing diagram 300 depicting transitions between high and low current sensing modes. FIG. 3B illustrates an embodiment of a timing diagram 302 depicting illegal and auto mode transitions.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
an array of two or more independently switchable power MOSFETs (metal-oxide-semiconductor field-effect transistors), wherein the power MOSFETs are further configured to sense current in a high current mode and a low current mode, wherein in the low current mode a sensed current output signal is scaled; and
circuitry for automatically switching from the low current mode to the high current mode when sensed current is above a threshold to switch to the high current mode.

2. The device of claim 1, wherein each MOSFET facilitates power passing to a load.

3. The device of claim 1, wherein the two or more MOSFETs are of different sizes.

4. The device of claim 1, wherein the two or more MOSFETs are arranged in a lateral configuration.

5. The device of claim 1, wherein at least one of the two or more MOSFETs is switched off during the low current mode.

6. The device of claim 1, wherein the device further comprises circuitry configured to automatically switch to the low current mode when sensed current is below a threshold to switch to the low current mode.

7. The device of claim 1, wherein the device further comprises circuitry configured to block switching to the low current mode when sensed current is above a threshold to switch to the low current mode.

8. The device of claim 1, wherein in the high current mode all of the MOSFETs are switched on.

9. The device of claim 1, wherein the MOSFETs are configured to sense current in a plurality of high current modes, a plurality of low current modes, or both.

10. The device of claim 1, wherein the threshold to automatically switch from the low current mode to the high current mode comprises approximately 1 A.

11. The device of claim 1, wherein a current sensing range of approximately 50 mA to 10 A is provided by the low current mode and the high current mode.

12. The device of claim 1, wherein the device further comprises circuitry for over current protection.

13. The device of claim 1, wherein the device further comprises circuitry for over temperature protection.

14. The device of claim 1, wherein the device further comprises NVM (non-volatile memory) for programming one or more parameters.

15. The device of claim 1, wherein the device comprises a power switch with current sense capability.

16. The device of claim 1, wherein the device comprises a load switch.

17. The device of claim 1, wherein the device comprises a power rail switch.

18. The device of claim 1, wherein the device comprises an integrated circuit.

19. A method, comprising:
configuring an array of two or more independently switchable power MOSFETs (metal-oxide-semiconductor field-effect transistors) to sense current in a high current mode and a low current mode, wherein in the low current mode a sensed current output signal is scaled; and
configuring circuitry for automatically switching from the low current mode to the high current mode when sensed current is above a threshold to switch to the high current mode.

20. The method of claim 19, wherein each MOSFET facilitates power passing to a load.

21. The method of claim 19, wherein the two or more MOSFETs are of different sizes.

22. The method of claim 19, wherein the two or more MOSFETs are arranged in a lateral configuration.

23. The method of claim 19, wherein at least one of the two or more MOSFETs is switched off during the low current mode.

24. The method of claim 19, further comprising configuring circuitry for automatically switching to the low current mode when sensed current is below a threshold to switch to the low current mode.

25. The method of claim 19, further comprising configuring circuitry for blocking switching to the low current mode when sensed current is above a threshold to switch to the low current mode.

26. The method of claim 19, wherein in the high current mode all of the MOSFETs are switched on.

27. The method of claim 19, wherein the MOSFETs are configured to sense current in a plurality of high current modes, a plurality of low current modes, or both.

28. The method of claim 19, wherein the threshold to automatically switch from the low current mode to the high current mode comprises approximately 1 A.

29. The method of claim 19, wherein a current sensing range of approximately 50 mA to 10 A is provided by the low current mode and the high current mode.

30. The method of claim 19, further comprising configuring circuitry for over current protection.

31. The method of claim 19, further comprising configuring circuitry for over temperature protection.

32. The method of claim 19, further comprising configuring NVM (non-volatile memory) for programming one or more parameters.

\* \* \* \* \*